United States Patent [19]

Stavraka et al.

[11] Patent Number: 4,918,573

[45] Date of Patent: Apr. 17, 1990

[54] ELECTRICAL CIRCUIT AND AN ADJUSTABLE COMPONENT SPACER USED THEREIN

[75] Inventors: Dean J. Stavraka; John W. Swann, both of Baltimore, Md.

[73] Assignee: Westinghouse Electric Corp., Pittsburgh, Pa.

[21] Appl. No.: 393,154

[22] Filed: Aug. 14, 1989

[51] Int. Cl.⁴ .......................... H05K 1/18; H05K 7/08
[52] U.S. Cl. ................................. 361/403; 174/138 G
[58] Field of Search .................... 174/138 G; 361/400, 361/403, 417, 418, 419

[56] References Cited

U.S. PATENT DOCUMENTS

| D. 200,157 | 1/1965 | Vincent | 174/138 G X |
| 3,962,719 | 6/1976 | Pfaff | 174/138 G X |
| 4,362,904 | 12/1982 | Schneider et al. | 174/138 G |
| 4,395,585 | 7/1983 | Polcyn | 174/138 G |

Primary Examiner—Laramie E. Askin

[57] ABSTRACT

A component spacer is disposed in an electrical circuit between a circuit component such as a resistor having two leads and a printed circuit board to which the resistor leads are connected to maintain a gap between them. The component spacer has a generally flat partition with vertically extending projections for contacting the printed circuit board. An elongated slot defined by a bifurcated section and a spaced aperture extend through the partition for receiving the resistor leads.

12 Claims, 2 Drawing Sheets

ELECTRICAL CIRCUIT AND AN ADJUSTABLE COMPONENT SPACER USED THEREIN

BACKGROUND OF THE INVENTION

The present invention relates to a component spacer for maintaining a gap between two components of an assembly of components. It is particularly useful for maintaining a gap in an electrical circuit between an electrical component such as a resistor and a printed circuit board to which it is electrically connected.

Component spacers are used in electrical circuits to space circuit components above printed circuit boards during the assembly process when the component leads are soldered to the boards. The spacers may be retained in place to permit heat from, e.g., high wattage resistors, to be dissipated in the air. The spacers are normally strips of Teflon or other suitably heat resistant plastic material which are wedged between the component and the circuit board to maintain a clearance. However, these strips may become loose in the assembly process or later in use because of the differences in thermal expansion between the component leads and the wedged strip. The strips may then be easily dislodged. Thus, the spacers sometimes are removed after the components are assembled on the printed circuit boards.

Thus, it is an object of the present invention to provide a component spacer which is self-locking and cannot become dislodged. Such a component spacer need not be intentionally removed before the board is used.

It is a further object of the present invention to provide a self-locking component spacer which has a substantial air gap between the component and the circuit board.

SUMMARY OF THE INVENTION

With these objects in view, the present invention resides in a component spacer for use in connection with an assembly of components such as an electrical circuit including printed circuit boards and other electrical components which will be held in place by component connectors such as electrical leads connected to a printed circuit board by soldering or other connection means.

The component spacer has a generally flat partition means which is adapted to be located between a component and a circuit board, The partition means has a bifurcated section defining an elongated slot extending therethrough for receiving one of the component connectors. A passageway, which is preferably an aperture, extending through the partition means is spaced from the slot for receiving another of the component connectors. First projections extend vertically from the partition means adjacent the slot and second projections extend vertically from the partition means adjacent the passageway.

Thus, the component connectors which extend through the slot and the passageway hold the component spacer in place. In addition, the vertical projections of the component spacers are configured to provide a relatively small footprint for contacting the circuit board which provides a substantial air gap and a small area for conductive heat transfer between the component and the circuit board. The substantial air gap also allows good visual inspection of solder points or other connection means. Further, the partition means is self-centering and self-leveling and is not shape-sensitive so that any shape may be used. Also, the partition means provides a means of protecting the circuit board in case of catastrophic failure of the component.

In a preferred embodiment of the present invention, the passageway is an aperture defined by the partition means. This permits the partition means to be at least rotatably held in place when only one of the component conductors is extended through the aperture toward the circuit board. The partition means then may be rotated into position and non-rotatably held in place by extending another component conductor through the slot to the point of attachment on the circuit board.

In a preferred embodiment of the invention there are a plurality of vertically extending projections adjacent the slot with serrations extending transversely of the slot between the projections. This structure permits distal portions of the bifurcated section to be parted from the partition means and the length of the partition means to be thereby adjusted to fit the length of the component and any lead spacing restrictions on the circuit board. This also permits a limited number of sizes to be stocked.

DESCRIPTION OF THE DRAWINGS

The invention will become more readily apparent from the following description of a preferred embodiment thereof shown, by way of example only, in the accompanying drawings, wherein.

DESCRIPTION OF A PREFERRED EMBODIMENT

Figure 1:
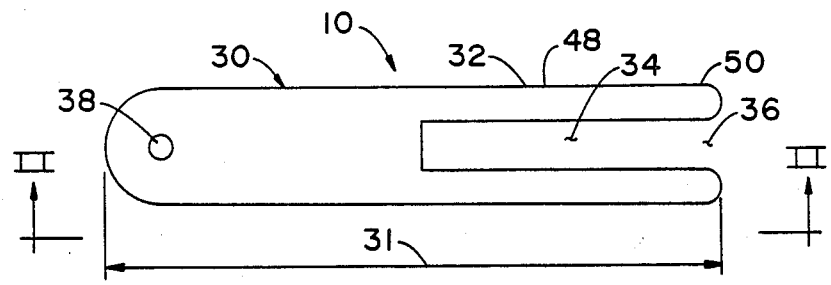
FIG. 1 is a top view of a component spacer embodying the present invention.
Figure 2:
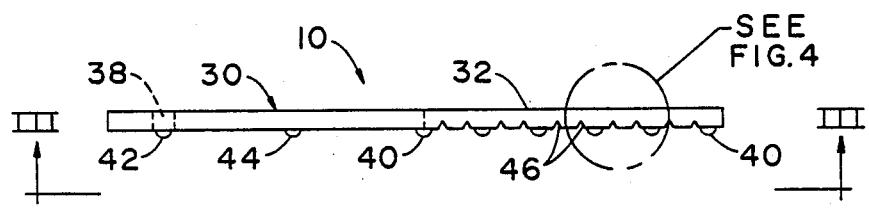
FIG. 2 is a side view of the component spacer of FIG. 1 taken along line II—II.
Figure 3:
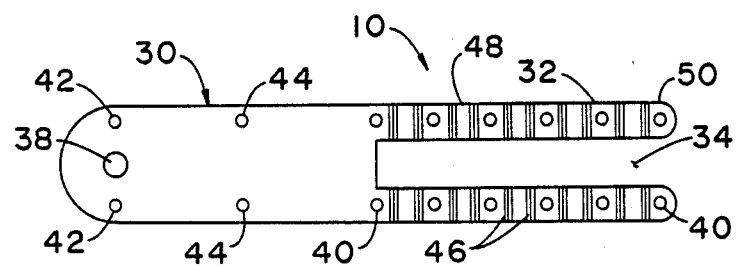
FIG. 3 is a bottom view of the component spacer of FIG. 2 taken along line III—III.
Figure 4:
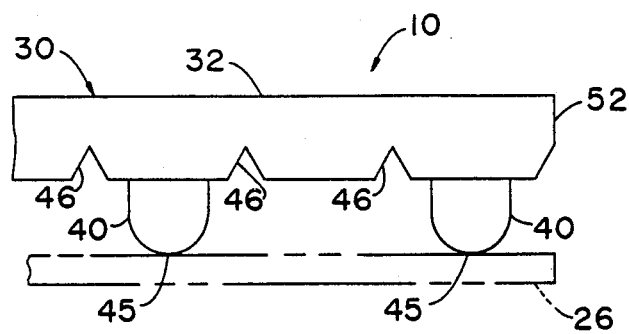
FIG. 4 is a partial side view of the component spacer as shown in the dashed line circle of FIG. 1 also showing a printed circuit board in phantom.
Figure 5:
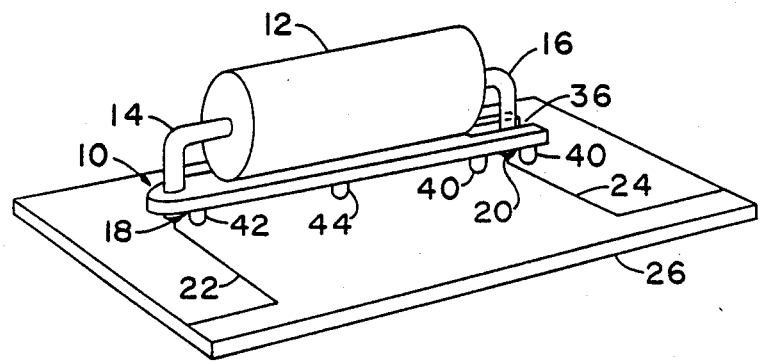
FIG. 5 shows a schematic perspective view of the component spacer shown in FIGS. 1 to 4 disposed between a component and a printed circuit board.

FIGS. 1 to 4 generally show a component spacer 10 which is useful in an electrical circuit such as the circuit partially shown in FIG. 5. FIG. 5 generally shows an electrical component such as a resistor 12 having two electrical leads 14, 16 which are soldered at points 18, 20 to printed lines 22, 24 of a circuit board 26. Generally speaking, component spacers embodying the present invention may be advantageously located between two interconnected components of any assembly.

The component spacer 10 has a generally flat partition means such as a partition or divider 30. The partition 30 has an overall length 31 which includes a bifurcated section 32. The bifurcated section 32 defines an elongated slot 34 having an open end 36 which is spaced from a passageway 38. The slot 34 and passageway 38 are adapted to receive the component connectors such as the electrical leads 14, 16. Preferably, the passageway 38 is an enclosed aperture as shown so that the component spacer 10 is at least rotatably locked in place by one of the component connectors 14. Thus, the component spacer 10 cannot become separated from the component 12 after the connector 14 is soldered to the circuit board 26 and cannot move lengthwise after the second connector 16 is soldered in. The passageway 38 may alternatively be elongated and also may be open-ended at one end of its length like the slot 34.

First projections 40 adjacent the slot 34, second projections 42 adjacent the passageway 38 and intermediate projections 44 vertically extend from the partition 30. These projections 40, 42, 44 establish an air gap between the component 12 and the circuit board 26. The projections 40, 42, 44 may be fingers extending from the partition 30 or may be raised dimples of the partition 30. In addition, as is best seen in FIG. 4, the projections 40, 42, 44 may be rounded or otherwise shaped at their distal ends 45 to provide a very small contact area.

As is best seen in FIGS. 3 and 4, serrations 46 extend transversely of the elongated slot 34 between the projections 40 from the slot 34 to the peripheral edge 48 of partition 30. These serrations 46 enable the distal ends 50 of the bifurcated section 32 to be parted from the partition 30 to adjust its length 31 in order to meet spacing restrictions on the circuit board 26. FIG. 4 generally shows the shortened distal end 52 of the bifurcated section of a component spacer which is adapted to extend to the end of a circuit board 26 (shown in phantom). Where the first projections 40 are widely spaced to provide a relatively large air gap in the bifurcated section 32, more than one serration 46 may be provided between adjacent projections 40 for closely adjusting the length 31 of the partition 30. The serrations 46 may be formed in any surface of the partition 30, but are preferably formed in the bottom surface so that the serrations would function as air gaps if the partition 30 were tilted to the extent that its peripheral edge 48 contacted or almost contacted the circuit board 26.

FIG. 5 generally shows a component spacer 10 made of heat resistant plastic which is designed for maintaining a total gap of about 0.75 mm to 1.5 mm (0.03 inch to 0.06 inch) between a resistor 12 rated at 5 watts or more and a circuit board 26. The projections 40, 42, 44 are about 0.7 mm (0.025 inch) in length for maintaining an air gap to dissipate heat to the air. The component spacer 10 shown in FIG. 5 is self-centering and self-leveling and permits ready visual inspection of solder points 18, 20 or other attachment means. Also, the component spacer 10 is mechanically locked in place by connectors 14, 16 so that the component spacer 10 cannot be dislodged from the circuit board 26.

The component spacer may additionally have vertically extending projections (not shown) for spacing the component 12 above the partition 30 in order to provide an air gap therebetween.

While a present preferred embodiment of the invention has been described and illustrated, it is to be distinctly understood that the invention is not limited thereto but may be otherwise variously embodied within the scope of the following claims.

What is claimed is:

1. A component spacer for use in an assembly of components having at least one component mechanically connected to another component by at least two connectors, comprising:

a generally flat partition means having a bifurcated section defining an elongated slot extending therethrough for receiving one of the component connectors and having a passageway extending therethrough spaced from the slot for receiving another of the component connectors; and projections extending vertically from the generally flat partition means, wherein the passageway is an aperture and the elongated slot has an open end, and where a plurality of projections extend along the elongated slot and serrations extend into the bifurcated section of the partition means transversely of the slot between the projections.

2. The component spacer of claim 1 wherein a plurality of serrations extend between adjacent projections.

3. The component spacer of claim 1 wherein the serrations extend from the elongated slot to the peripheral edge of the bifurcated section of the partition means.

4. The component spacer of claim 1 wherein the projections have rounded distal ends.

5. A component spacer for maintaining a gap between an electrical component and a printed circuit board to which the component is electrically attached by at least two connectors, comprising:

a generally flat partition having a bifurcated section defining an elongated slot extending therethrough for receiving one of the connectors and having an aperture extending therethrough which is spaced from the slot for receiving another of the connectors; and projections extending vertically from the partition for contacting a printed circuit board, wherein a plurality of projections vertically extend along the elongated slot and serrations extend into the bifurcated section of the partition transversely of the elongated slot between the projections.

6. The component spacer of claim 5 wherein a plurality of serrations extend between adjacent projections.

7. The component spacer of claim 5 wherein the serrations extend from the elongated slot to the peripheral edge of the bifurcated section of the partition.

8. The component spacer of claim 5 wherein the projections have rounded distal ends.

9. An electrical circuit including a component thereof electrically connected to a printed circuit board by at least two connectors with a component spacer between the component and the printed circuit board, the component spacer having:

a generally flat partition having a bifurcated section defining an elongated slot extending therethrough and an aperture extending therethrough and spaced from the slot with one connector extending in the slot and one other connector extending in the aperture; and projections extending vertically from the partition having distal ends in contact with the printed circuit board, wherein a plurality of projections extend along the elongated slot and serrations extend into the bifurcated section of the partition transversely of the elongated slot between the projections.

10. The electrical circuit of claim 9 wherein a plurality of serrations extend between adjacent projections.

11. The electrical circuit of claim 9 wherein the serrations extend from the elongated slot to the peripheral edge of the bifurcated section of the partition.

12. The electrical circuit of claim 9 wherein the projections have rounded distal ends.

* * * * *